United States Patent [19]
Okamura et al.

[11] Patent Number: 6,081,316
[45] Date of Patent: Jun. 27, 2000

[54] APPARATUS FOR EXPOSURE OF PRINTING PLATES USING IMAGE MODIFICATION

[75] Inventors: Yuichi Okamura; Takemi Watanabe, both of Osaka-fu, Japan

[73] Assignee: Kabushiki Kaisha Kaneda Kikai Seisakusho, Osaka, Japan

[21] Appl. No.: 09/192,601

[22] Filed: Nov. 17, 1998

[30] Foreign Application Priority Data

Nov. 20, 1997 [JP] Japan .................................. 9-319319

[51] Int. Cl.⁷ .......................... G03B 27/00; G03B 27/58; G21C 17/00
[52] U.S. Cl. ............................... 355/18; 355/47; 347/250
[58] Field of Search .................................. 355/27–29, 40, 355/41, 47, 48, 52, 85–89; 358/471, 474, 299; 347/250, 262

[56] References Cited

U.S. PATENT DOCUMENTS

| | | | |
|---|---|---|---|
| 4,987,499 | 1/1991 | Kimura | 358/474 |
| 5,323,241 | 6/1994 | Yonezawa | 358/298 |
| 5,495,539 | 2/1996 | Seiverding | 382/276 |
| 5,627,670 | 5/1997 | Minoura et al. | 359/212 |
| 5,750,985 | 5/1998 | Suzuki | 250/234 |
| 5,825,913 | 10/1998 | Rostami et al. | 382/151 |
| 5,978,010 | 11/1999 | Hosokawa | 347/250 |

*Primary Examiner*—Safet Metjahic
*Assistant Examiner*—Hung Henry Nguyen
*Attorney, Agent, or Firm*—Griffin & Szipl, P.C.

[57] ABSTRACT

A recorded image is distorted on a printing plate when an image information for a computer is recorded in the form of a band with a band width of a plurality of image elements on a printing plate wound around a drum. This invention provides an undistorted recording on the printing plate, made possible by an arrangement that has a printing plate wound around a drum in the form of a right circular cylinder, an exposure unit that uses a light beam to record image information in the form of a band on the printing plate, a moving mechanism to move the exposure unit by one band width in the direction of the drum axis in relation to the drum while the drum makes a revolution, an image treating apparatus with the image information stored in the form of a right quadrangle, and an image modulator to rearrange and slant each band of image information readout from said image treatment apparatus by one band width in the opposite direction to the movement of said moving mechanism.

6 Claims, 11 Drawing Sheets

APPARATUS FOR EXPOSURE OF PRINTING PLATES USING IMAGE MODIFICATION

FIELD OF THE INVENTION

The present invention relates to an apparatus for exposure of printing plates and more particularly to an arrangement for recording image information, on a printing plate wound around a drum, according to image signals from a computer.

DESCRIPTION OF RELATED ART

The recent progress of computer information processing and image treatment technologies has found its way into such fields as newspaper printing, bringing about development of a method of drawing an image directly on printing plates by laser beams in accordance with signals from the computer (as opposed to by way of the photographic film). The printing plate known in the printing industry as PS plate or pre-sensitized aluminum base plate, is widely used as a printing plate material for the purpose.

Hitherto, a drum-rotating system known as facsimile apparatus has been used to draw an image on such a printing plate. Laser beams are applied in the process of image drawing on the plate around the drum. To raise the drawing efficiency, a plurality of beams has come to be used rather than a single beam. Hereinafter, therefore, the system of recording information in the form of a band using a plurality of laser beams will be described as prior art.

Such an apparatus as mentioned above for drawing an image on the printing plate as shown in FIG. 9 is known as a multi-beam system. In FIG. 9, reference numeral 2 indicates a horizontally positioned drum that is driven and rotated in the direction of the arrow a by a motor M. A printing plate 4 is wound on the outer circumferential surface of the drum 2. Since printing plate 4 is wound in the form of a right circular cylinder with the starting sideline 6 and the end sideline 8 not shifting from each other, top line 10 and bottom line 12 are positioned in parallel to each other in the direction of the drum axis.

Optical devices are mounted on an optical base 14 in which a laser beam emitting from a laser beam source 16 such as semiconductor laser passes through a multi-beam generating element such as gratings and Wollaston prism to be divided into a multi-beam. This multi-beam then passes through a group of AOM's (audio-optical modulators) 20 switch-controlled by image signals from an image treating apparatus PT, enters an exposure unit provided with a light source array 22 made up of optical fibers, and is irradiated onto printing plate 4 through a lens 24. This light source array 22 is one example of the exposure units to directly record an image on the printing plate. An image band 26 with a bandwidth B corresponding to the width of the multi-beam irradiation is recorded on the printing plate 4. A moving mechanism H is provided to move the optical unit 14 by a distance of the band width B in the direction of the arrow b continuously at a uniform rate per one rotation of the drum, i.e., during the time in which drum 2 makes one revolution.

The exposure apparatus mentioned above has a significant problem. As shown in FIG. 10, drum 2 rotates at a constant speed with the optical base 14 moving by a distance of the bandwidth B for every revolution of the drum. That is, the recorded image band 26 is shifted by a distance of the bandwidth B for every revolution of the drum and forms a spiral band around printing plate 4. Unwound and opened, printing plate 4 has a recorded image made up of a number of strips of the image band 26 but the completed image is a parallelogram shifted by a distance of band width B because the image band is recorded in the form of a spiral. A printing plate 4 with a recorded image 28 distorted in this way is not suitable for printing.

Suppose that a 128-beam light source array 22 is adopted for a newspaper printing plate with a drum circumference of 46 inches and an image element density of 909 dots/inch, then the band width B, which corresponds to 128 image elements, is $128/909=0.14$ inch or 3.6 mm. Because of the spiral recording, the top line 28c and the bottom line 28d of the recorded image 28 are shifted from each other by 3.6 mm, which shift is visually apparent. In addition, the angle $\theta$ of inclination, calculated from $\tan \theta = 0.14/46$, is 0.17 degrees. That is, the starting sideline 28a and the end side 28b will have an inclination of 0.17 degrees, though they are parallel to each other.

As a way to avoid this distortion of the recorded image, an intermittent moving method as outlined in FIG. 11 was proposed. In this method, the optical unit 14 is left standing while the drum 2 makes a revolution recording the image. Then the optical base 14 is moved by a distance of the bandwidth B by means of a moving mechanism H. The time for the movement has to be set at an integral multiple of the time needed for the drum to make a revolution. This intermittent moving system allows the image band 26 to form a right cylinder shape without spiraling. Thus the recorded image 28 is recorded on printing plate 2 in the form of a regular quadrangle without distortion. The problem is, however, that intermittent moving makes the total exposure time longer, lowering the efficiency of plate-making work. Furthermore, repeated moving and stopping of the heavy optical system makes the apparatus complicated and expensive, and can cause vibration, leading to deterioration of picture quality and to mechanical trouble.

SUMMARY OF THE INVENTION

It is an object of the present invention to provide an apparatus for exposure of printing plates to solve problems such as those discussed above by utilizing image modification.

This object is attained by providing an apparatus for exposure of printing plates for recording image information in the form of a spiral band, with a plurality of image elements of the recording band width, on the surface of a printing plate wound around a drum according to the present invention, which comprises a printing plate wound around the drum in a regular cylindrical form, an exposure unit to record an image information in band shape on the printing plate by means of optical beam, a moving mechanism to more the exposure unit in relation to the drum by a distance of one band width in the direction of the drum axis in relation to the drum while the drum makes one revolution, an image treating apparatus with image information memorized in the form of a regular quadrangle, and an image transformer to rearrange each band of image information read from the image treating apparatus, so that the band is inclined by an amount of one band width in the opposite direction to the direction of the movement of the moving mechanism, thereby recording the image information which is read from the image transformer and which is free from distortion with respect to the printing plate.

The above-mentioned inclining distortion of the band is caused by the relative movement over a distance of one band width that the base of the exposure unit makes in relation to the drum in the direction of the drum axis while the drum makes one revolution. After extensive study to find a way to eliminate the inclining distortion of the band, it has been discovered that what causes the inclining distortion not to be removed is that the image information memorized by the image treating apparatus is a regular quadrangle. The present invention involves the recognition that if the regular quadrangular image information in the image treating apparatus is allowed to be inclined in advance in the opposite direct to the relative movement mentioned above, the inclination would be offset by the relative movement, with the result that a regular quadrangular image information is formed on the printing plate.

BRIEF DESCRIPTION OF THE DRAWINGS

FIGS. 1A–1C comprise conceptual schema of image modification according to the present invention, in which FIG. 1A shows unmodified image information B, FIG. 1B shows modified image information M, and FIG. 1C shows printed images (B).

DETAILED DESCRIPTION OF SPECIFIC EMBODIMENTS

Following is a list of acronyms used herein, along with indications of their derivations and/or significance.

| Acronym | Derivation |
| --- | --- |
| AOM | Audio-Optical Modulator |
| PM | Picture Modificator (image transformer) |
| DG | Drum standard position signal Generating circuit |
| WG | Writing address Generating circuit |
| WCC | Writing address Correction Circuit |
| WCG | Writing Clock Generator |
| WA | Writing Address |
| PMM | Picture Modificator Memory storage |
| PT | Picture Treating apparatus |
| RG | Read-out address Generating circuit |
| RA | Read-out Address |
| RCG | Read-out Clock Generator |
| PT | Picture Treater (image treating apparatus) |
| PE | Picture End information |
| XG | deflector-driving circuit |
| AOD | Audio-Optical modulator used as Deflector |

FIRST EXAMPLE

Figure 1A:
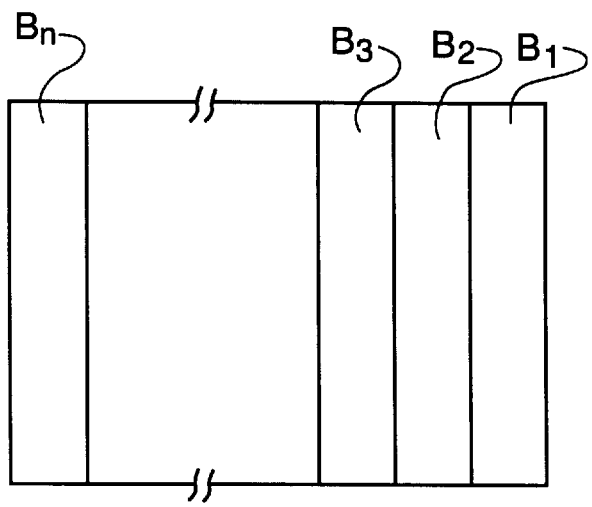
Figure 1B:
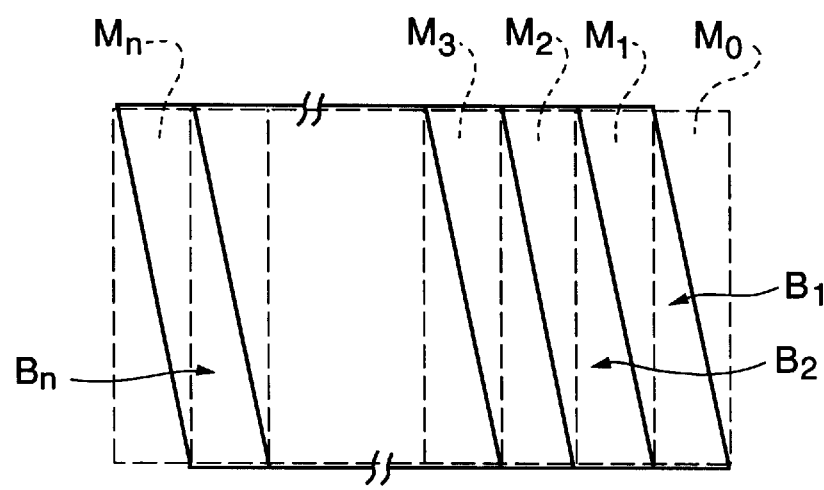
Figure 1C:
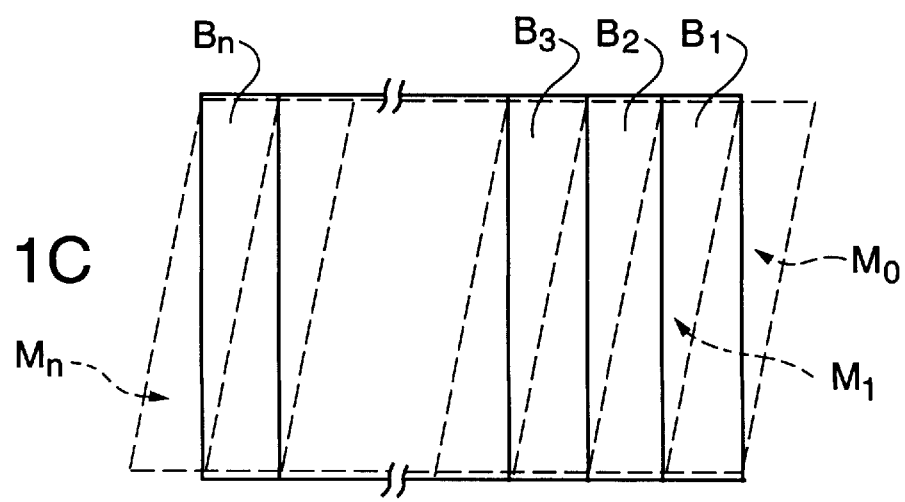
Figure 10A:
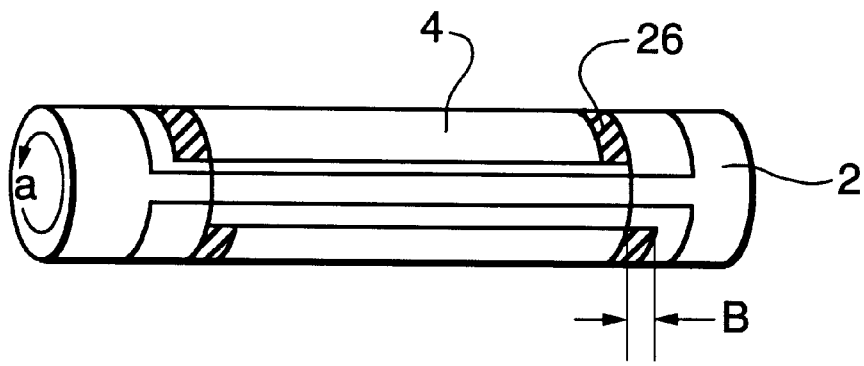
FIGS. 10A and 10B comprise an explanatory diagram showing how the recorded image is tilted and distorted on the printing plate in the apparatus shown in FIG. 9.
Figure 10B:
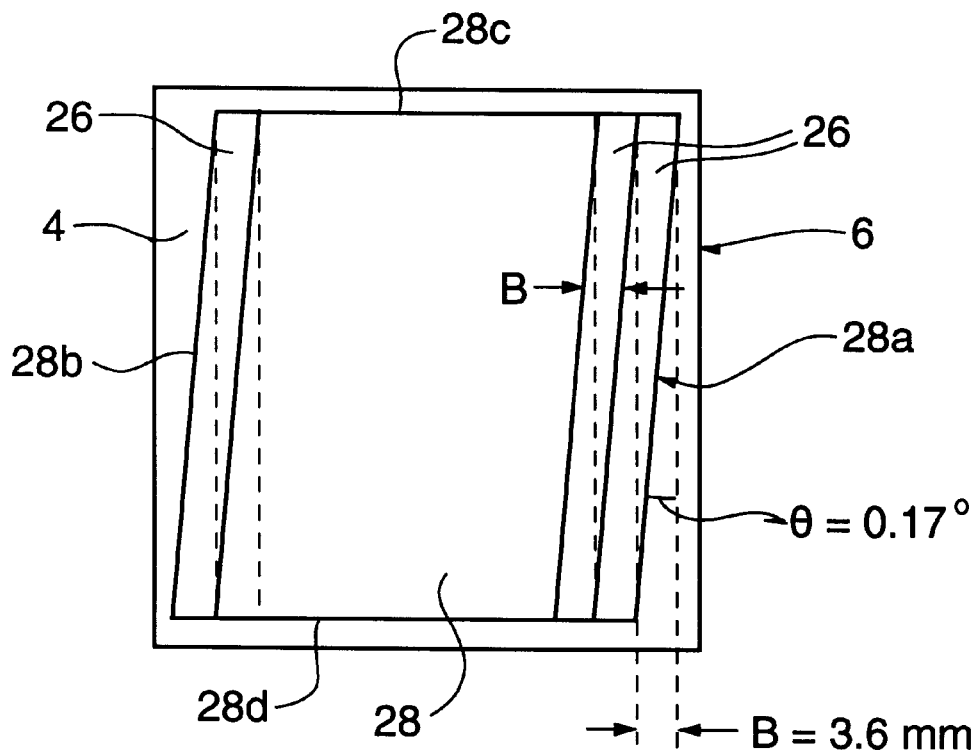
Figure 11A:
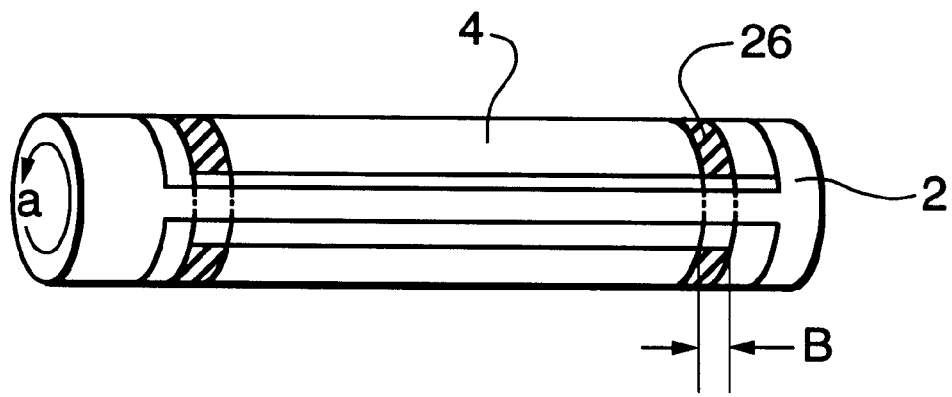
FIGS. 11A and 11B comprise an explanatory diagram showing that intermittent moving of the exposure unit can avoid distortion of recorded image frames (prior art).
Figure 11B:
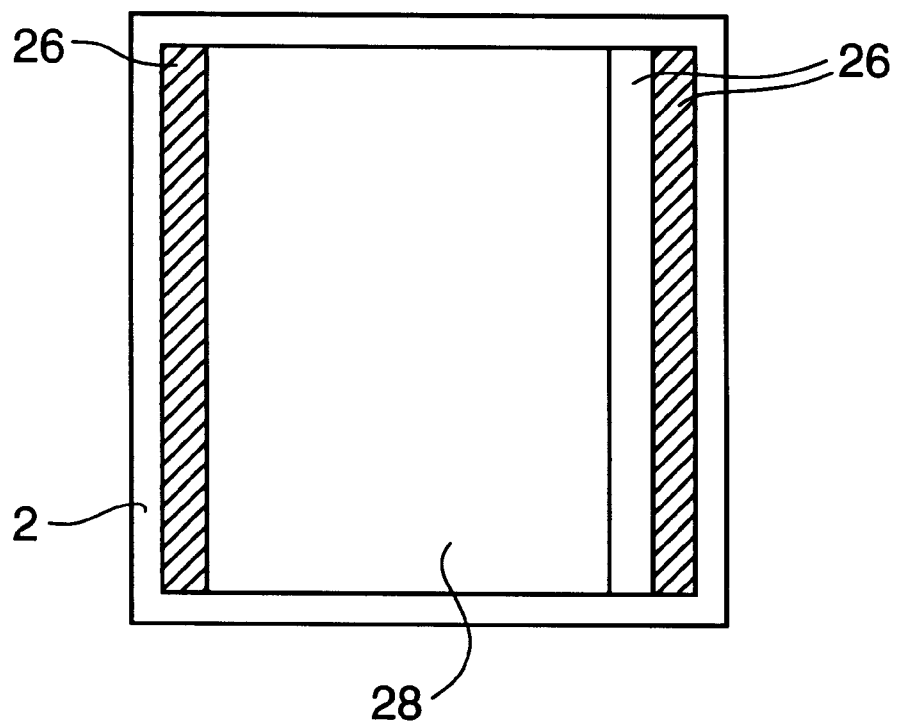

FIGS. 1A–1C show a concept of image modification, the core of the present invention. FIG. 1A shows image information in the form of a regular quadrangle memorized in the image treating apparatus, consisting of n vertically extending bands, B1 to Bn. If this image information is output into the exposure unit in this form, then the recorded image will be inclined as shown in FIG. 10B, on the printing plate in the direction in which the exposure unit is moved. To avoid this problem, the bands B1 to Bn are rearranged and inclined as shown in FIG. 1B in a solid line, by an amount equal to the width B, but in the opposite direction, by means of the image transformer PM, and memorized. The opposite direction means the direction opposite to the direction in which the exposure unit is moved and is, at the same time, opposite to the direction in which the recorded image is inclined in FIG. 10B. If the parallelogram made up of the inclined bands B1 to Bn is covered by vertical bands as indicated in dotted line, it is covered by bands Mo to Mn numbering (n+1).

Then, the (n+1) vertical bands Mo to Mn of FIG. 1B are recorded on the printing plate by means of the exposure unit. The result is that the bands Mo to Mn are inclined in the direction of movement of the exposure. It follows that the bands B1 to Bn included in the bands Mo to Mn are vertically recorded on the printing plate as illustrated in FIG. 1C. Thus, a regular quadrangle of recorded image can be formed on the printing plate.

In the system just described, after all the bands in the image treating apparatus have been read into the image transformer PM, the bands are recorded on the printing plate. This procedure can be freely arranged by applying computer technology. It is also possible that with a reading of the bands from the image treating apparatus into the image transformer preceding the start of recording on the printing plate, the bands are recorded from the image transformer on the printing plate in parallel with the reading.

Figure 2:
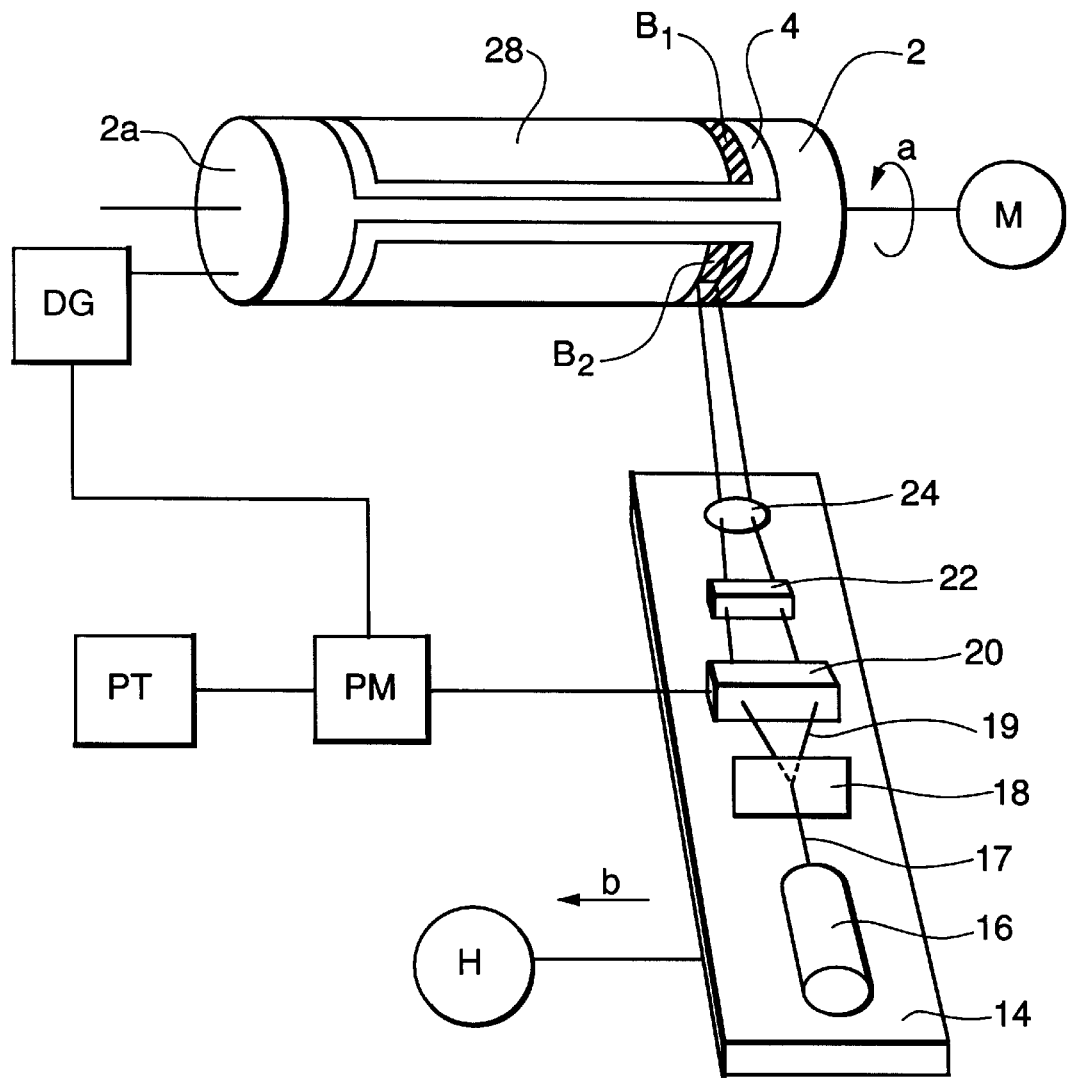
FIG. 2 is a constitutional diagram of a first example of the present invention.
Figure 9:
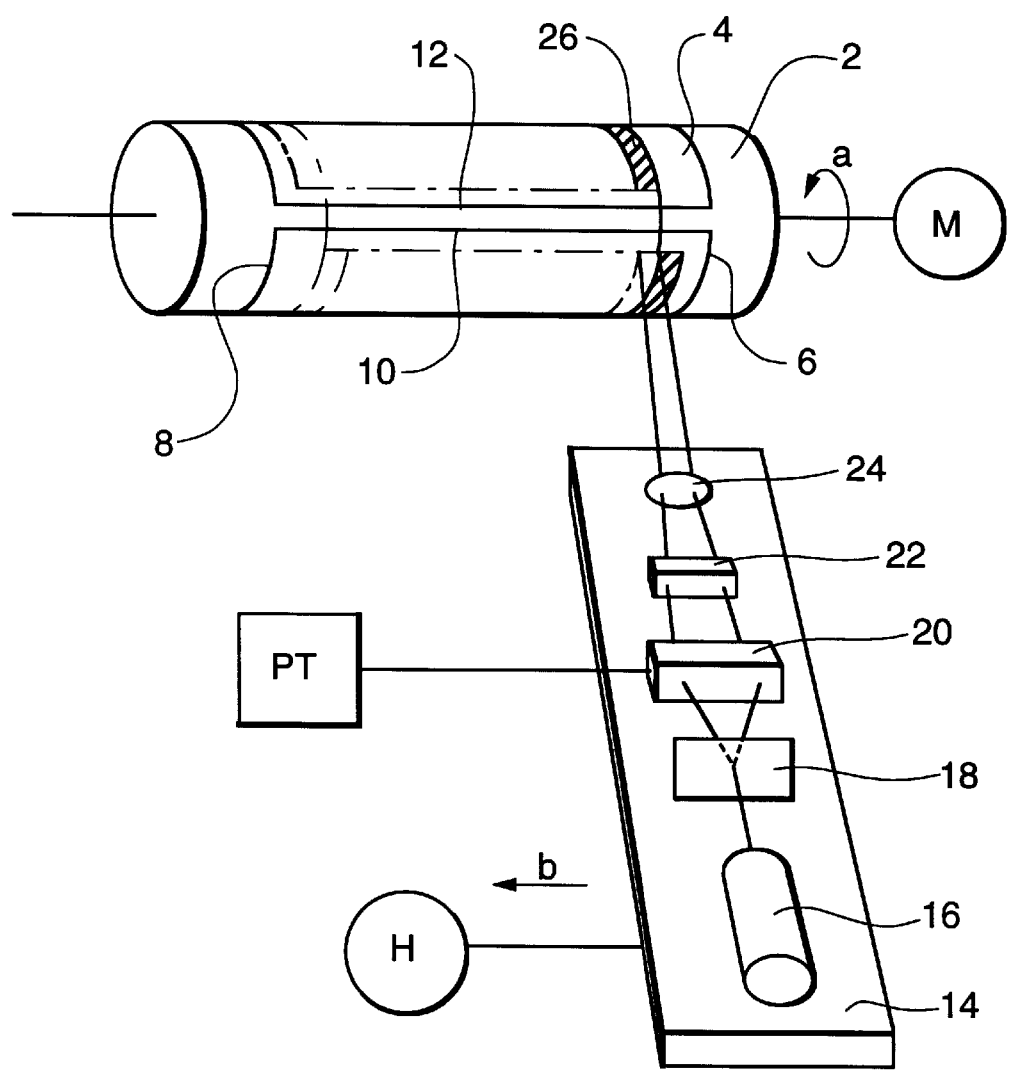
FIG. 9 is a constitutional diagram of a prior art apparatus for exposure of printing plates.

FIG. 2 is a constitutional diagram of a first example of the present invention, showing a multi-beam system. The parts that correspond to those of the prior art (FIG. 9) are identified with common reference numerals. Laser beam 17 emitted from laser beam source 16 mounted on optical base 14 is split by multi-beam generating element 18 into, for instance, 128 rays to form multi-beam 19. This multi-beam, switch-controlled by AOM group 20 on receipt of the image signal from image transformer PM, takes the image information as on-off signals. The multi-beam 19 passes through a light source array 22 made of a large number (for instance, 128) of optical fibers, then is converged by a lens 24 and records bands B1, B2, . . . to form a recorded image 28.

In the present example, light source array 22 serves as an exposure unit and the number of optical fibers forms the bandwidth B. That is, the multi-beam system records information corresponding to a bandwidth simultaneously. A 128-fiber multi-beam produces a 128-dot band.

Since the drum circumference is 46 inches as mentioned above, the number of dots to be produced in the longitudinal direction of the band is 46×909=41814 dots. In the multi-beam system, therefore, when drum 2 makes one revolution, the band width information of 128 dots is recorded 41814 times, forming one band. A drum standard position signal generating circuit DG produces a pulse signal for the standard position of the drum at the start of bands B1, B2, . . . The mechanism is that a mirror (not shown) is attached to the end face 2a of drum 2. A laser beam is irradiated on end face 2a of the drum so that the beam reflected by the mirror produces a pulse each time drum 2 makes one rotation.

Alternative to this light signaling, it is possible to use known techniques such as electromagnetic pulses and rotary encoders.

Figure 3:
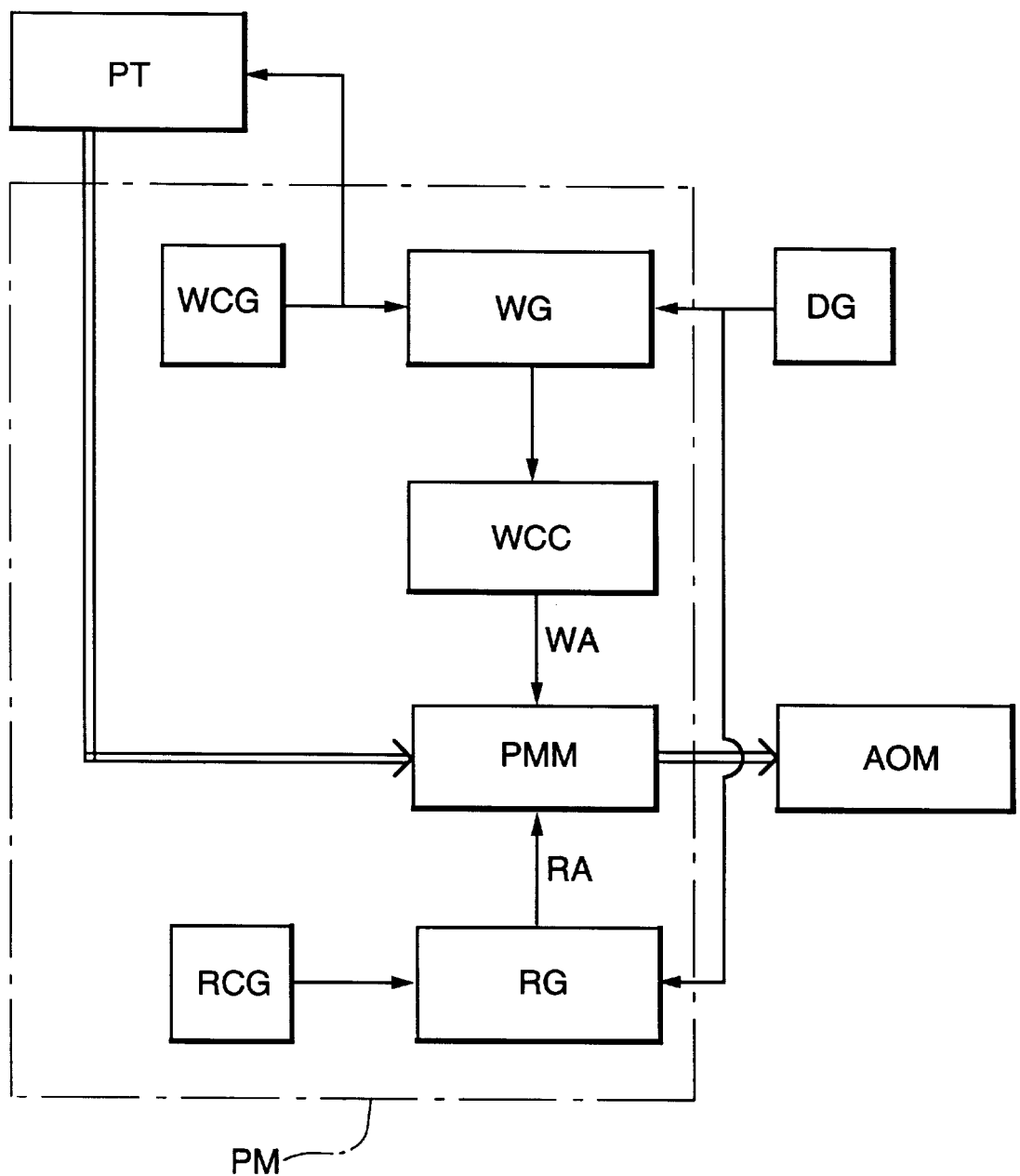
FIG. 3 is a block diagram of the image transformer of the first example of the present invention.

FIG. 3 is a block diagram showing image transformer PM in detail. Receiving a signal from drum standard position signal generating circuit DG, a writing address generating circuit WG sends a writing address signal to writing address correction circuit WCC in accordance with the clock of a writing clock generator WCG. At this signal, writing address correction circuit WCC sends a writing address WA to image modification memory storage PMM. Image information from the image treating apparatus PT is stored in writing address WA.

Vertical bands Mo, M1, Mn shown in FIG. 1B are recorded in image modification memory storage PMM at a high rate. When a second rotation of the drum starts, read-out address generating circuit RG is activated at a second signal from drum standard position signal generating circuit DG. Circuit RG sends a read-out address RA for the band Mo to image modification memory storage PMM according to the clock of read-out clock generator RCG. The image information stored in this read-out address RA is read out from the image modification memory PMM and is sent out to the AOM group 20.

Bandwidth B is 128 dots in the present example. One-band-width information of 128 dots per one-read-out is sent to AOM group 22 and recorded on printing plate 4. While drum 2 makes one revolution, 41814 read-outs and recordings take place on printing plate 4, thereby completing recording on the band Mo. At the third signal from circuit DG, recording on band M1 starts, followed by recording on band M2 at the fourth signal, and so on. Finally, at signal (n+2), recording on the band Mn is effected with the result that formation of recorded image 28 on printing plate 4 is completed.

Figure 4:
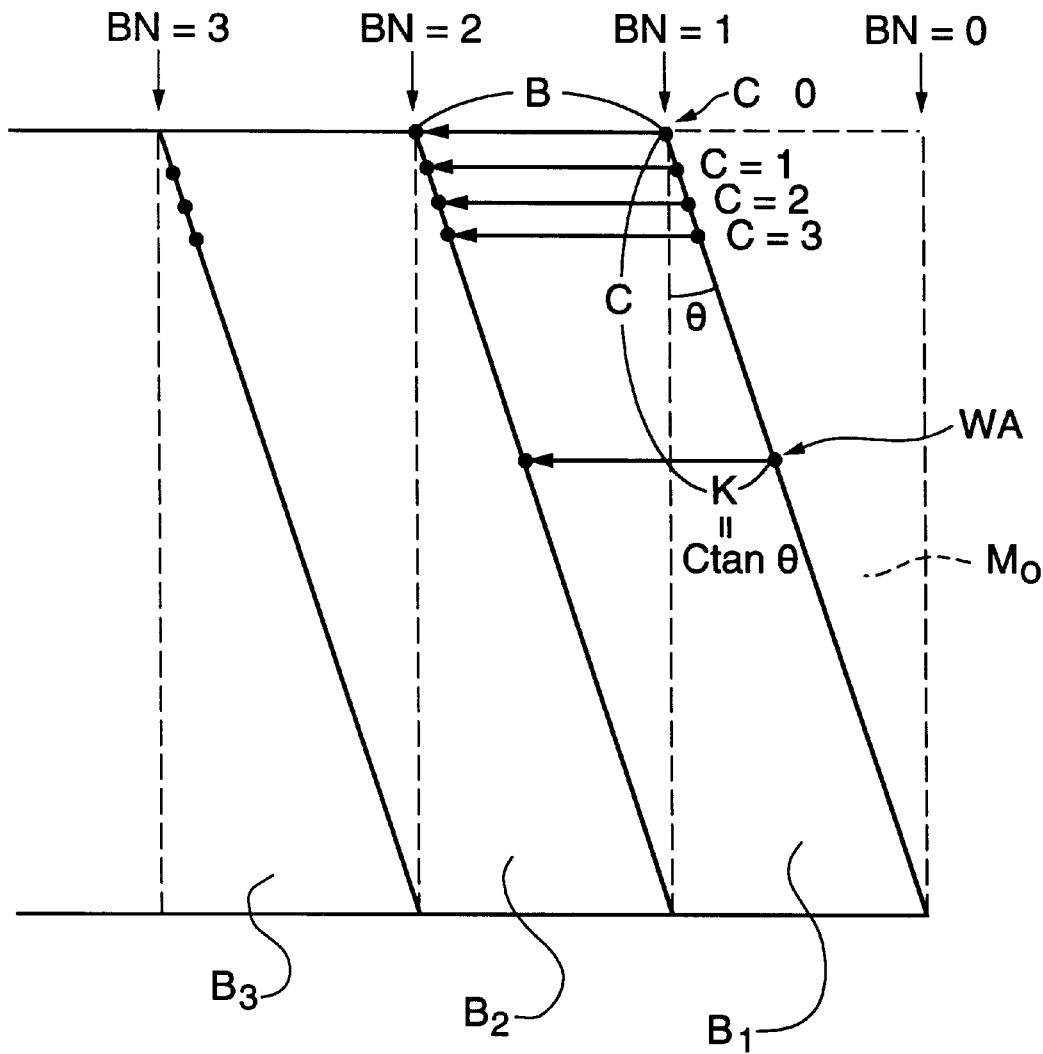
FIG. 4 is a conceptual schema showing the method of writing image information of the first example.
Figure 5:
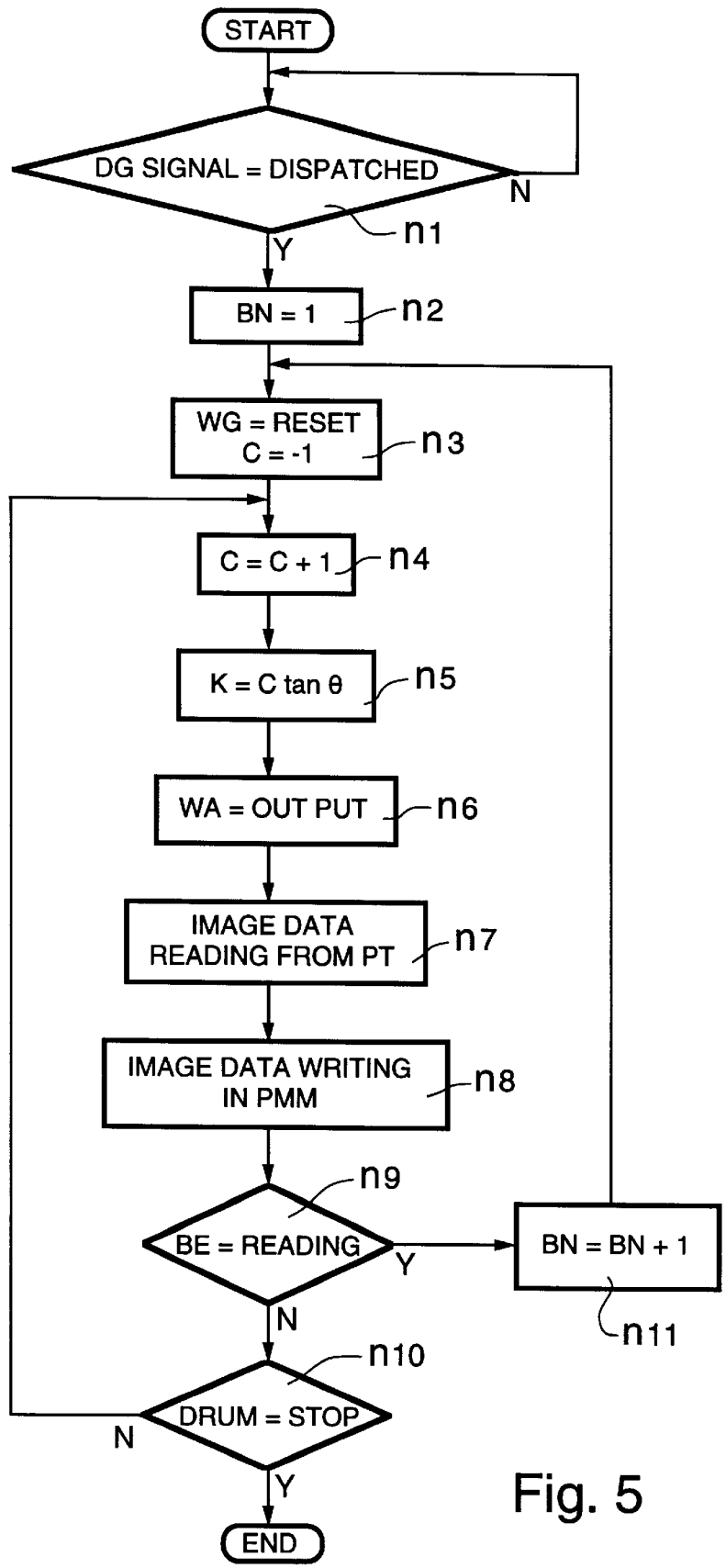
FIG. 5 is a flow chart showing the process of writing image information of the first example.

FIGS. 4 and 5 are a conceptual schema and a flow chart, showing the process of writing the image information in the image modification storage PMM.

The apparatus for exposure of printing plates is activated and drum 2 starts to rotate. When the first signal is then received from drum standard position signal generating DG (step n1), band number BN is set at 1 (step n2). Then writing address-generating circuit WG is reset and bandwidth number C is initialized to −1 (step n3).

If the number C becomes 0 in step n4, calculation produces k=0 (step n5). Writing address WA in the memory designated with C=0 in FIG. 4 is sent to image modification memory storage PMM (step n6). The first band width information of the first band B1 is read out from image treating apparatus PT (step n7), and is written in the designated memory of image modification memory storage PMM (step n8).

The function of the writing address correction circuit WCC is now described in detail. For the sake of illustration, the writing of the band width information of the first band B1 at band width number C shown in FIG. 4 will be considered in which the starting point of writing is the position shifted right by K=C tan θ from the dotted vertical line indicated by BN=1. The circuit for calculation of the writing address of this starting point is the writing address correction circuit WCC. This circuit WCC may be a matrix circuit to calculate the writing address WA from two kinds of information, that is, the number BN and the number C, or known circuits can be used.

To continue, the complete first band information is written in the image modification memory storage PM with the band width number C being increased by one each time until the band end information BE is reached (step n9). In the present example, the final number for C is 41814. When the band end information BE is reached (step n9), the band number BN is increased by one (step n11) and the second band B2 specified with BN=2 starts to be written in the image modification memory storage PMM. When the writing of all bands B1 to Bn is complete and a recorded image 28 is completed on printing plate 4 with drum 2 coming to a stop (step n10), this flow comes to a close. This flow may be terminated when the image end information PE that indicates the end of the whole image is read out (step n10).

In the flow chart of FIG. 5, the writing of image information in image modification memory storage PMM starts at the first DG signal and proceeds continuously quite independently of recording on printing plate 4 until all information is written. In this case, image modification memory storage PMM requires the same amount of memory capacity as image treating apparatus PT.

In another system, memory storage PMM with a memory capacity of, for instance, 100 bands, is provided. First, writing of information of 100 bands is started, and some time is allowed for recording on the printing plate to proceed. When recording of the $100^{th}$ band begins, the $101^{st}$ to $200^{th}$ bands are then written in memory storage PMM. By repeating that procedure, all information can eventually be written.

In still another system, two sets of the image modification memory storage PMM are used. Image information of a first 100 bands is written in one set and information of a second 100 bands in the other set. Recording on a printing plate 4 is started with one of the two sets and when it is over, recording is switched to the other set. As soon as recording of the first 100 bands is finished, the writing of information of a third 100 bands is started. When writing and recording are done alternatively in that manner, the work can be done continuously and efficiently.

Figure 6:
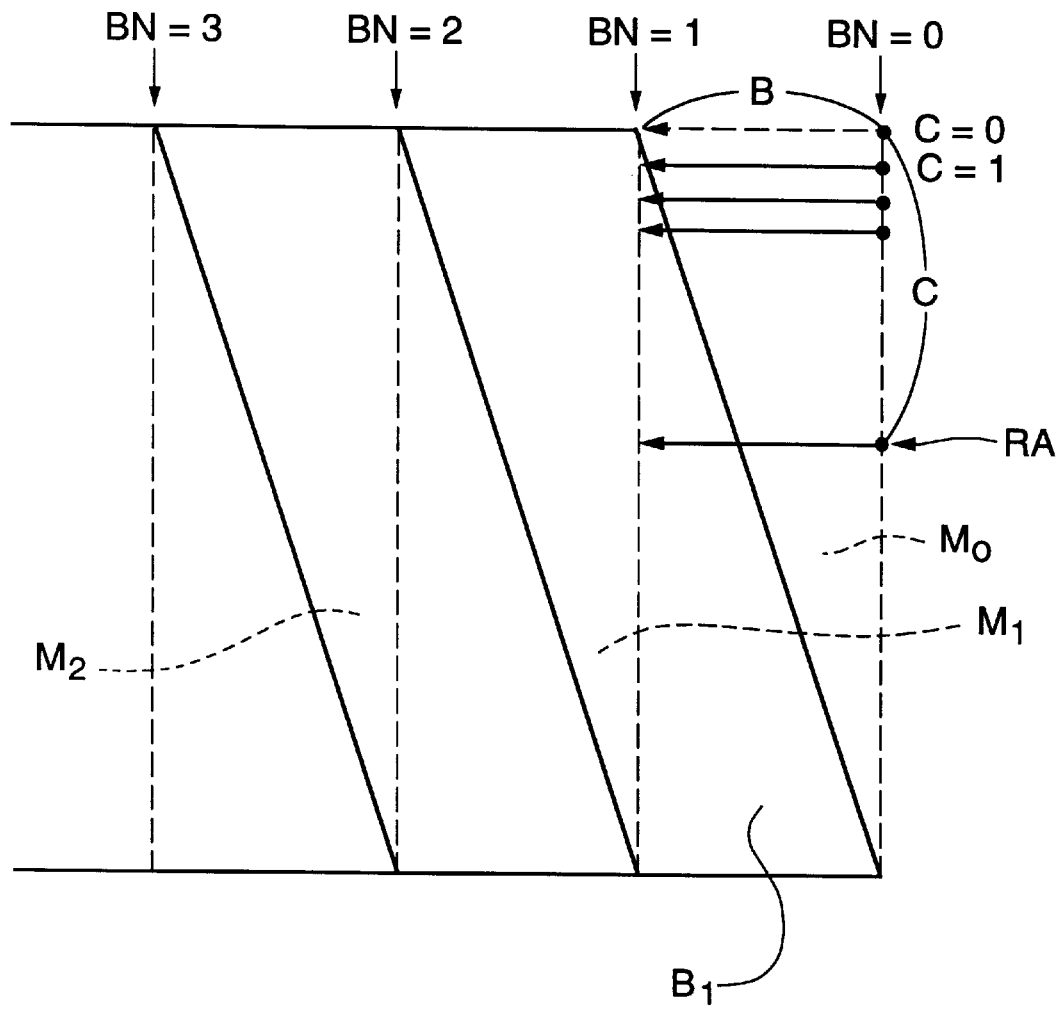
FIG. 6 is a conceptual schema showing the process of reading out image information of the first example.
Figure 7:
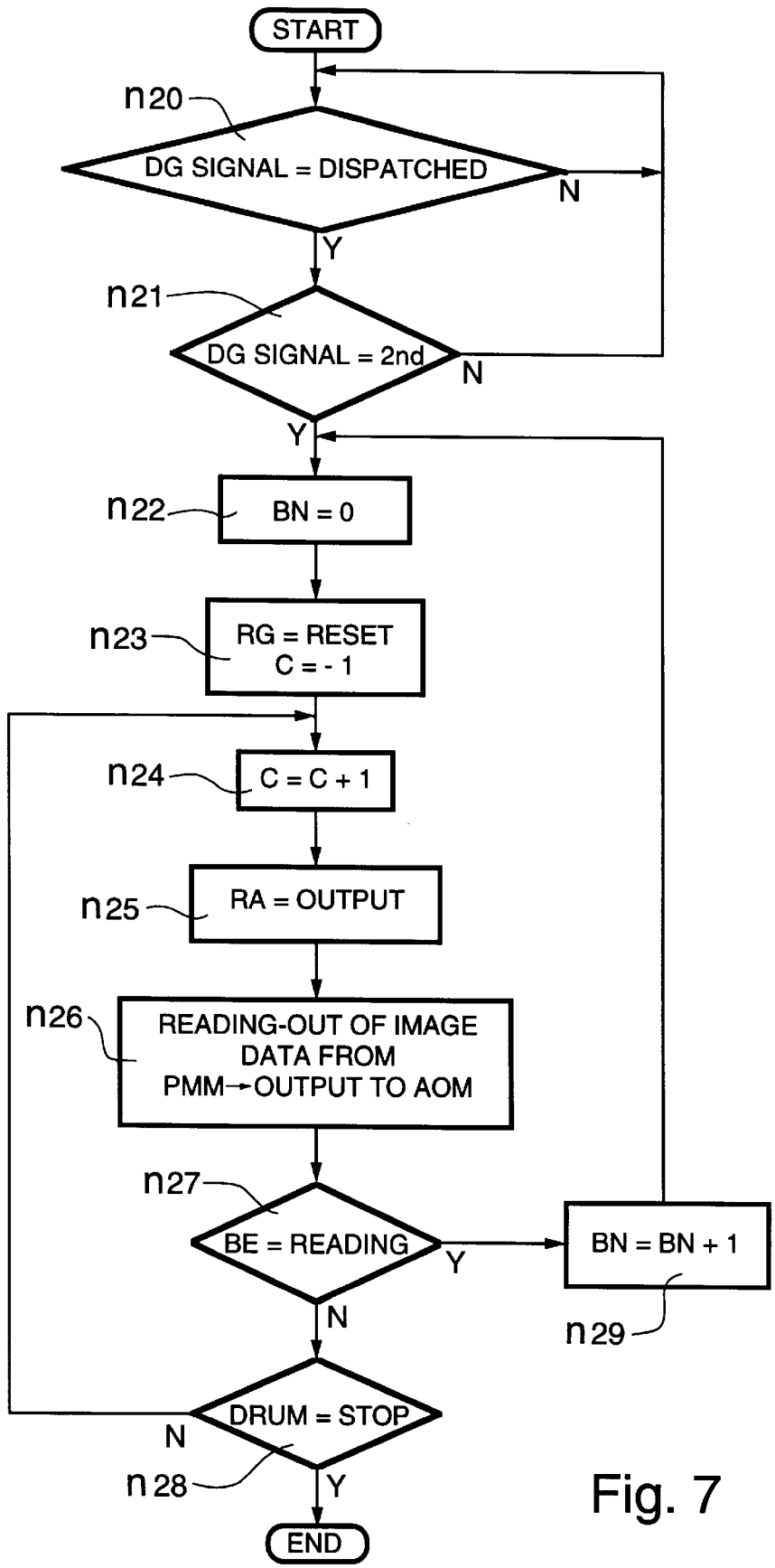
FIG. 7 is a flow chart showing the process of reading out image information of the first example.

FIGS. 6 and 7 are a conceptual schema and a flow chart showing the process of reading out image information from image modification memory storage PMM.

When the drum turns and the second signal is received from drum standard position signal generating circuit DG (steps n20 and n21), the band number BN is set at 0 (step n22) and read-out address generating circuit RG is reset so that the band width number C is initialized at −1 (step n23). The band number BN=0 means that the $0^{th}$ band Mo is to be read out. It is noted that writing is done in the order of B1, B2 . . . Bn while read-out is done with the vertical bands Mo, M1, . . . Mn.

When the number C is 0 in step n24, read-out address RA for BN=0 and C=0 is transmitted to image modification memory storage PMM from read-out address generating circuit RG (step n25). Then the image information of the 128-dot bandwidth stored in read-out address RA is transmitted from image modification memory storage PMM to AOM group 20. There, each multi-beam is subject of on-off control by the AOM group so that the $0^{th}$ bandwidth information of the $0^{th}$ band Mo is recorded on printing plate 4 (step n26).

The band width number C continues to increase one by one as the recording of the $0^{th}$ band Mo goes on until the band end information BE is reached (step n27). In the present example, the final band width information if C=41814. When this final bandwidth information is read out, the band end information BE is read (step n27). Then the band number BN increases by one (step n29) and the read-out of BN=1 or the first band M1 starts.

In this way, the vertical bands Mo, M1 ... Mn are read out one after another and, with the AOM group controlled, all image information is recorded on printing plate 4. When the final band Mn is recorded, drum 2 stops (step n28). Thus, the recorded image is completed.

SECOND EXAMPLE

Figure 8:
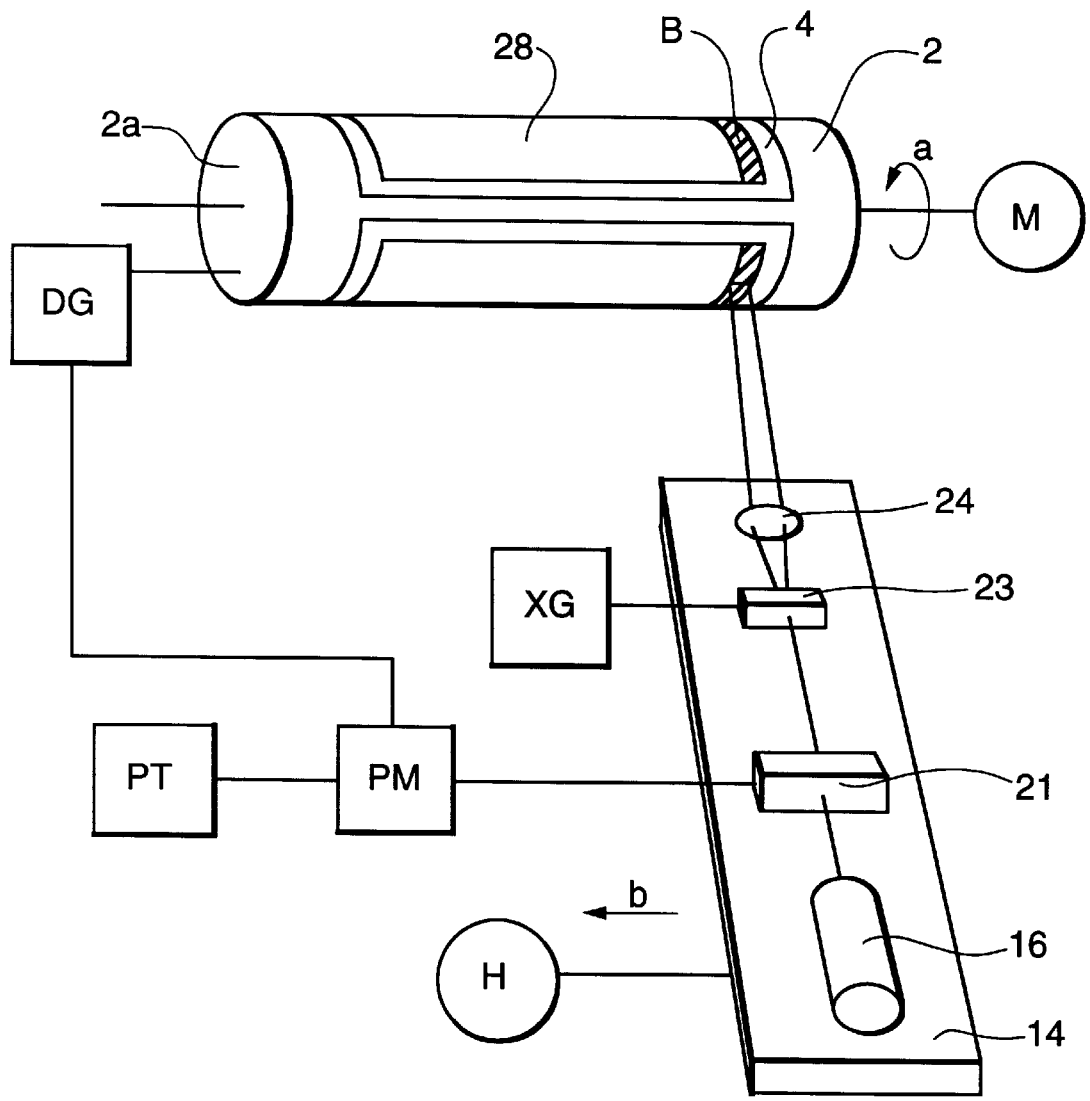
FIG. 8 is a constitutional diagram of a second example of the present invention.

FIG. 8 is a constitutional diagram of a second example of the present invention illustrating a single beam system. The parts identical with those in FIG. 2 are given common reference numerals. In the following description, emphasis is put on the parts that differ.

The laser beam emitted from laser beam source 16 is on-off controlled with the image information of image modulator PM by AOM 21. This laser beam enters a deflector 23 (i.e., the exposure unit of the second example) and is controlled to be deflected by an amount of the bandwidth B only (128 dots, for instance). The beam controlled to be deflected by the deflector 23 records the bands B1, B2, Bn to form a recorded image 28 on the printing plate 4 via a lens 24.

There is provided a deflector-driving circuit XG to drive deflector 23. An audio-optical deflector AOD may be used as the deflector. The AOD is an exposure unit that changes the lattice interval by means of high frequency, diffracts the incident beam, and accomplishes scanning. Containing no mechanical components, this sort of exposure unit is highly reliable. In this system, the deflector-driving circuit XG is a high-frequency generating circuit that varies the frequency.

A vibrating mirror can be used in place of the AOD. A mirror is mounted on the shaft of a vibrating motor or a galvanometer and is vibrated right and left within a very small angle range to record information in the band. An oscillating circuit of a saw-tooth wave of a definite frequency can be used for the deflector-driving circuit XG.

Variations and Changes

In the first example, a laser beam from laser beam source 16 is split into a multi-beam, and a light source array 22 made of optical fibers is used. Instead of the laser beam source, light-emitting diodes can be used. That is to say, light-emitting diodes are aligned as light source array, and on-and-off of those light-emitting diodes is controlled by image signal from image modulator PM. This light-emitting diode array can be used in the present invention if the light energy output can be increased. Because multi-beam is used, the, above-mentioned light source array has an advantage in that with a band width having 128 image elements, for instance, if a light source array for 128 beams is provided, all information for the band width can be recorded simultaneously. Of course the bandwidth and the band length can be freely chosen.

The moving mechanism H mentioned earlier is so arranged as to move the optical unit 14 on which the exposure unit is mounted. Instead, drum 2 can be provided with a moving mechanism H by which drum 2 can be moved in the opposite direction to arrow b. It is also acceptable to equip drum 2 and optical unit 14 both with moving mechanisms H so that the two can be moved simultaneously. In short, if drum 2 and the exposure unit move relative to one another by one bandwidth distance per one revolution of the drum, recording can be done. It is preferable that the moving speed should be constant. But if there is any change in the number of revolutions of drum 2, the moving speed of the drum may change, in order to ensure that a distance of the movement is equal to a band width per every revolution of the drum. It is also possible that the exposure unit alone is moved with the optical unit 14 as a whole left stationary, or the exposure unit is moved along with part of the optical system.

In the examples given above, the printing plate is wound around the outer circumferential surface. The plate can be mounted on the inside circumference instead, resulting in an "inside surface system". In this system, a lens and a mirror are so provided on the shaft of drum 2 that a bundle of light rays from the exposure unit is reflected to record an image band on the inside surface of the drum. In the inside surface system, the optical unit can be made to run inside the drum.

The present invention makes it possible to form an undistorted recorded image on a printing plate. It does so by causing the image information in the form of a right quadrangle within the image treating apparatus to distort—by means of an image transformer—by an amount of the band width B but in the opposite direction. This eliminates distortion that has been noticed with close observation in mass-printed materials in the past. Moreover, it frees the optical system from the necessity of frequent repeated moving and stopping. In addition, the time needed before printing may commence is shortened, which is a feature of great value to newspaper publishers. As shown by the description herein above, the present invention can achieve highly practical results.

While the invention has been described with reference to specific embodiments thereof, it is to be understood that this invention is not limited thereto. Variations and/or change in designs and arrangements are possible without departing from the spirit or scope of the present invention.

What is claimed is:

1. An apparatus for exposing a printing plate wound around a drum to record image information in a form of a spiral band having a plurality of image elements of recording band width on said printing plate, which apparatus comprises a printing plate wound in a form of a regular circular cylinder around a drum, an exposure unit to record image information in the form of a band on said printing plate by means of a light beam, a moving mechanism to move said exposure unit in relation to said drum by a distance of one band width in the direction of the drum axis during a time the drum makes one revolution, an image treating apparatus with the image information stored in the form of a regular quadrangle, and an image transformer (PM) to rearrange and slant each band of image information read out from said image treating apparatus by one band width in the opposite direct to a moving direction of said moving mechanism, wherein the image transformer (PM) comprises a writing clock generator (WCG), a writing address generating circuit (WG) sending a writing address signal in accordance with a clock signal of the writing clock generator, a writing address correction circuit (WCC) sending a writing address (WA) at the writing address signal from the writing address generating circuit, a read-out clock generator (RCG), a read-out address generating circuit (RG) generating a read-out address (RA) in accordance with the clock signal of the read-out clock generator, and an image modification memory storage (PMM) to which the writing address is input from the writing address correction circuit such that the image information from the image treating apparatus (PT) is memorized in the writing address and to which the read-out address is input from the read-out address generating circuit such that the image information memorized in the read-out address is output to an audio-optical modulator (AOM).

2. The apparatus of claim 1, wherein said moving mechanism moves an exposure unit at a constant speed in the direction of the drum axis in relation to a stationary drum.

3. The apparatus of claim 1, wherein said moving mechanism moves a drum at a constant speed in the direction of the drum axis in relation to a stationary exposure unit.

4. The apparatus of claim 1, wherein said printing plate is wound around an outer circumferential surface of said drum.

5. The apparatus of claim 1, wherein said printing plate is wound around an inner circumferential surface of said drum.

6. The apparatus of claim 1, wherein said light beam is a laser beam or a light beam of a light emitting diode.

* * * * *